(12) United States Patent
Kim

(10) Patent No.: US 10,431,324 B2
(45) Date of Patent: Oct. 1, 2019

(54) DATA STORAGE DEVICE FOR PERFORMING DECODING OPERATION AND OPERATING METHOD THEREOF

(71) Applicant: SK hynix Inc., Gyeonggi-do (KR)

(72) Inventor: Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/908,973

(22) Filed: Mar. 1, 2018

(65) Prior Publication Data

US 2019/0056992 A1    Feb. 21, 2019

(30) Foreign Application Priority Data

Aug. 18, 2017  (KR) .................. 10-2017-0105006

(51) Int. Cl.
| G11C 29/52 | (2006.01) |
| G06F 11/10 | (2006.01) |
| G06F 11/07 | (2006.01) |
| H03M 13/11 | (2006.01) |
| G11C 29/02 | (2006.01) |

(Continued)

(52) U.S. Cl.
CPC .......... *G11C 29/52* (2013.01); *G06F 11/076* (2013.01); *G06F 11/0727* (2013.01); *G06F 11/1012* (2013.01); *G06F 11/1068* (2013.01); *G11C 29/028* (2013.01); *G11C 29/42* (2013.01); *H03M 13/1105* (2013.01); *G11C 29/36* (2013.01)

(58) Field of Classification Search
CPC ....... G11C 29/52; G11C 29/42; G11C 29/028; G11C 29/36; H03M 13/1105; G06F 11/1068; G06F 11/076; G06F 11/0727; G06F 11/1012

See application file for complete search history.

(56) References Cited

U.S. PATENT DOCUMENTS

| 5,684,810 A * | 11/1997 | Nakamura ............ H03M 13/15 |
| | | 714/755 |
| 6,332,206 B1 * | 12/2001 | Nakatsuji ............... G11B 20/18 |
| | | 714/755 |

(Continued)

FOREIGN PATENT DOCUMENTS

| KR | 100415136 | 4/2004 |
| KR | 101203235 | 11/2012 |

OTHER PUBLICATIONS

S. Tanakamaru, A. Esumi, M. Ito, K. Li and K. Takeuchi, "Post-manufacturing, 17-times acceptable raw bit error rate enhancement, dynamic codeword transition ECC scheme for highly reliable solid-state drives, SSDs," 2010 IEEE International Memory Workshop, Seoul, 2010, pp. 1-4.*

*Primary Examiner* — Cynthia Britt
(74) *Attorney, Agent, or Firm* — IP & T Group LLP

(57) ABSTRACT

A data storage device includes a nonvolatile memory device configured to store a codeword; and a controller configured to read the codeword from the nonvolatile memory device, and perform a decoding process for the codeword, wherein, when performing the decoding process, the controller calculates a flag of the codeword, calculates an expected number of errors by applying an adjustment coefficient to the flag, compares the expected number of errors to an allowed number of errors, and skips or performs a decoding operation for the codeword depending on a comparison result.

20 Claims, 10 Drawing Sheets

(51) Int. Cl.
*G11C 29/42* (2006.01)
*G11C 29/36* (2006.01)

(56) References Cited

U.S. PATENT DOCUMENTS

| | | | |
|---|---|---|---|
| 7,694,207 B1* | 4/2010 | Kline | H03M 13/1575 |
| | | | 714/781 |
| 2004/0194005 A1* | 9/2004 | Huggett | H03M 13/27 |
| | | | 714/795 |
| 2011/0107188 A1* | 5/2011 | Dror | H03M 13/152 |
| | | | 714/773 |
| 2015/0286421 A1* | 10/2015 | Chen | G06F 3/0617 |
| | | | 714/764 |
| 2017/0116076 A1* | 4/2017 | Sharma | G11C 29/02 |
| 2017/0310342 A1* | 10/2017 | Yen | H03M 13/3715 |

* cited by examiner

DATA STORAGE DEVICE FOR PERFORMING DECODING OPERATION AND OPERATING METHOD THEREOF

CROSS-REFERENCES TO RELATED APPLICATION

The present application claims priority under 35 U.S.C. § 119(a) to Korean application number 10-2017-0105006, filed on Aug. 18, 2017, which is incorporated herein by reference in its entirety.

BACKGROUND

1. Technical Field

Various embodiments of the present disclosure generally relate to a data storage device. Particularly, the embodiments relate to a data storage device including a nonvolatile memory device.

2. Related Art

Memory systems store data provided by an external device in response to a write request. Memory systems may also provide stored data to an external device in response to a read request. Examples of external devices that use memory systems include computers, digital cameras, cellular phones, and the like. Memory systems may be embedded in an external device during manufacturing of the external devices or may be fabricated separately and then connected afterwards to an external device.

SUMMARY

Various embodiments are directed to a data storage device capable of quickly performing a booting operation, and an operating method thereof.

In an embodiment, a data storage device may include: a nonvolatile memory device configured to store a codeword; and a controller configured to read the codeword from the nonvolatile memory device, and perform a decoding process for the codeword, wherein, when performing the decoding process, the controller calculates a flag of the codeword, calculates an expected number of errors by applying an adjustment coefficient to the flag, compares the expected number of errors to an allowed number of errors, and skips or performs a decoding operation for the codeword depending on a comparison result.

In an embodiment, a method for operating a data storage device may include: reading a codeword from a nonvolatile memory device; and performing a decoding process for the codeword, the performing of the decoding process including calculating a flag of the codeword; calculating an expected number of errors by applying an adjustment coefficient to the flag; comparing the expected number of errors to an allowed number of errors; and skipping or performing a decoding operation for the codeword depending on a comparison result.

In an embodiment, a memory system may include: a memory device configured to store a plurality of codewords composed of same data used to boot the memory system; and a controller configured to selectively perform a decoding operation for one of the codewords based on an expected number of errors and an allowed number of errors of the respective codewords during booting the memory system.

The data storage device and the operating method thereof according to the embodiments may quickly complete a booting operation.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Figure 1:
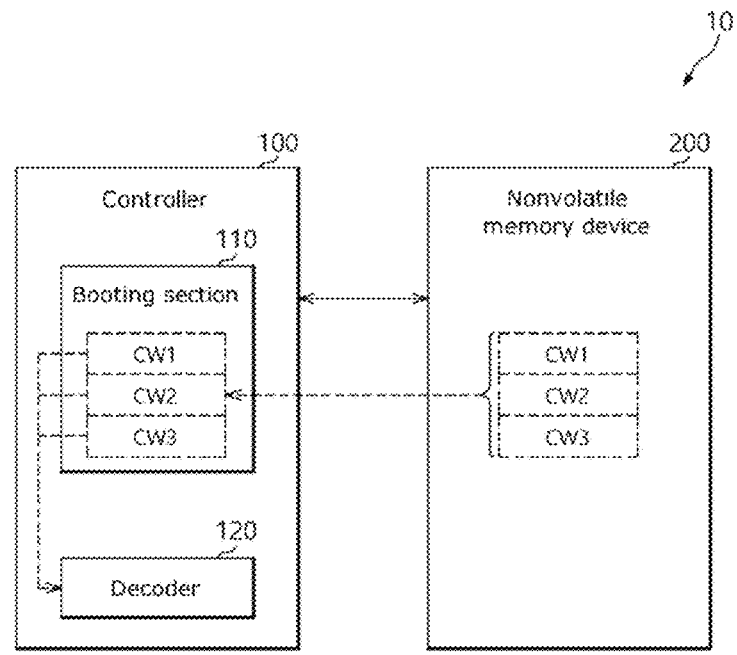
FIG. 1 is a block diagram illustrating a data storage device in accordance with an embodiment of the present disclosure.

Hereinafter, a memory system and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data storage device 10 in accordance with an embodiment of the present disclosure.

The data storage device 10 may store data provided from an external device in response to a write request from the external device. Also, the data storage device 10 may provide the stored data to the external device in response to a read request from the external device.

The data storage device 10 may be configured by a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD), and the like.

The data storage device 10 may include a controller 100 and a nonvolatile memory device 200.

The controller 100 may control general operations of the data storage device 10. The controller 100 may store data in the nonvolatile memory device 200 in response to a write request transmitted from the external device, and may read data stored in the nonvolatile memory device 200 and output the read data to the external device in response to a read request transmitted from the external device.

The controller 100 may include a booting section 110 and a decoder 120.

The booting section 110 may read codewords CW1 to CW3, which are composed of the same data, from the nonvolatile memory device 200, and may perform a booting operation by using a codeword for which a decoding operation has succeeded, among the codewords CW1 to CW3. That is, a single codeword may be stored in the nonvolatile memory device 200 as a plurality of copies, i.e., the codewords CW1 to CW3, in case of a corruption. After being powered on, the booting section 110 may simultaneously read the codewords CW1 to CW3, and may sequentially input the codewords CW1 to CW3 to the decoder 120. According to an embodiment, the booting section 110 may input a subsequent codeword to the decoder according to a predetermined sequence 120 when the decoding operation for a previous codeword fails.

The decoder 120 may perform the decoding process for each of the codewords CW1 to CW3 to correct the errors included in the codewords CW1 to CW3. The codewords CW1 to CW3 may sequentially undergo the decoding process according to a predetermined decoding sequence. The decoding process may be performed until the decoding operation succeeds for any one among the codewords CW1 to CW3. When the decoding operation succeeds for any one of the codewords CW1 to CW3, the decoding process may not be performed for the remaining codewords.

Meanwhile, the decoding sequence of the codewords CW1 to CW3 may be determined irrespective of the error states of the codewords CW1 to CW3. In this case, if a codeword of a preceding decoding order includes too many errors, a booting operation may not be quickly performed. This is because the decoding process for a codeword having a relatively low probability of correcting due to a high percentage of errors included therein may require a long decoding time, which may exceed a predefined allowed time for each controller. Therefore, as will be described later, the decoder 120 according to the embodiment may selectively terminate quickly the decoding process for a previous codeword where too many errors are expected, and may proceed to the decoding process for a subsequent codeword. Thus, because the decoder 120 does not perform an unnecessary decoding operation for a codeword having a low probability of succeeding in decoding, the data storage device 10 may complete booting within an allowed time range.

The decoding process performed for any one codeword, for example, the codeword CW1, may be described in detail as follows. First, the decoder 120 may calculate the flag of the codeword CW1, calculate an expected number of errors by applying an adjustment coefficient to the flag, and compare the expected number of errors with an allowed number of errors. The decoder 120 may calculate the row syndromes of the row codewords of the codeword CW1, calculate the column syndromes of the column codewords of the codeword CW1, and calculate as the flag the product of the sum of the row syndromes and the sum of the column syndromes. The expected number of errors may be obtained by predicting the number of errors included in the codeword CW1. The expected number of errors may be calculated as the product of the flag and the adjustment coefficient. The adjustment coefficient may be determined experimentally as will be described later, and may be used in converting the flag of the codeword CW1 into the number of errors included in the corresponding codeword CW1.

The decoder 120 may skip or perform the decoding operation for the codeword CW1 depending on a result of comparing the expected number of errors and the allowed number of errors. In detail, when the expected number of errors exceeds the allowed number of errors, the decoder 120 may skip the decoding operation for the codeword CW1 and output a decoding failure signal and terminate the decoding process.

However, when the expected number of errors is less than the allowed number of errors, the decoder 120 may perform the decoding operation for the codeword CW1.

The decoder 120 may repeat the decoding operation for the codeword CW1. The codeword CW1 may be corrected while repeatedly undergoing the decoding operation. In order for quick termination of the decoding process, according to an embodiment, the decoder 120 may repeat the decoding operation for the codeword CW1 up to an allowed repetition count. In other words, when a repetition count of the decoding operation exceeds the allowed repetition count although the decoding operation for the codeword CW1 has not succeeded yet, the decoder 120 may stop the decoding operation and output a decoding failure signal and terminate the decoding process. However, when a repetition count of the decoding operation is less than the allowed repetition count and the decoding operation for the codeword CW1 has not succeeded yet, the decoder 120 may repeat the decoding operation for the codeword CW1.

Also, in order for a quick termination of the decoding process, according to an embodiment, the decoder 120 may determine whether to continue or stop the decoding operation according to the method described above even while performing the decoding operation for the codeword CW1. In detail, the decoder 120 may calculate a second flag corrected from the codeword CW1 while performing the decoding operation for the codeword CW1, calculate a second expected number of errors by applying the adjustment coefficient to the second flag, and compare the second expected number of errors with the allowed number of errors. When the second expected number of errors is less than the allowed number of errors, the decoder 120 may subsequently perform the decoding operation for a second codeword. However, when the second expected number of errors exceeds the allowed number of errors, the decoder 120 may stop the decoding operation for the second codeword, output a decoding failure signal and terminate the decoding process. Such an operation may be to prepare for a case where the number of errors rather increases in a subsequent codeword due to the decoding operation for previous codewords, thereby increasing a time required for the decoding process on the subsequent codeword.

The nonvolatile memory device 200 may store the data transmitted from the controller 100, read stored data, and transmit the read data to the controller 100 according to the control of the controller 100.

The nonvolatile memory device 200 may store the codewords CW1 to CW3 which are composed of the same data, read the codewords CW1 to CW3, and transmit the read codewords CW1 to CW3 to the controller 100 according to the control of the controller 100. Each of the codewords CW1 to CW3 may be encoded based on the turbo product code (TPC) algorithm and be then stored in the nonvolatile memory device 200. While FIG. 1 illustrates that three copies of a codeword are stored, the present disclosure is not limited thereto. That is, any suitable number of copies of a codeword may be stored.

The nonvolatile memory device 200 may include a flash memory, such as a NAND flash or a NOR flash, a Ferro-electrics Random Access Memory (FeRAM), a Phase-Change Random Access Memory (PCRAM), a Magneto-resistive Random Access Memory (MRAM), a Resistive Random Access Memory (ReRAM), and the like.

While it is illustrated in FIG. 1 that the data storage device 10 includes one nonvolatile memory device 200, it is to be noted that the number of nonvolatile memory devices included in the data storage device 10 is not limited thereto. When the data storage device 10 includes a plurality of nonvolatile memory devices 200, the codewords CW1 to CW3 may be distributed to at least two nonvolatile memory devices 200.

Figure 2:
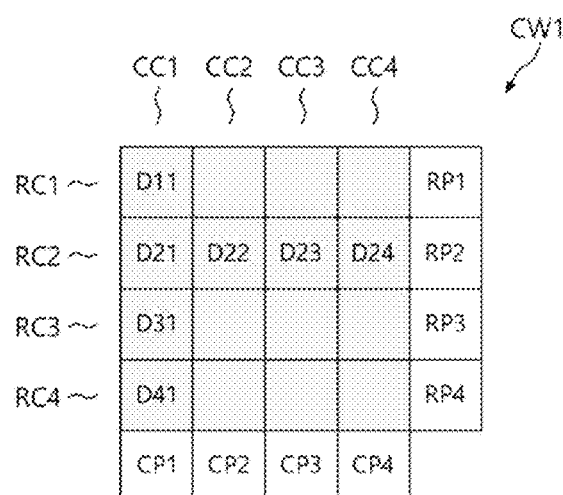
FIG. 2 is a diagram illustrating an example of a codeword based on the turbo product code (TPC) algorithm.

FIG. 2 is a diagram illustrating an example of the codeword CW1 based on the TPC algorithm. The codewords CW2 and CW3 of FIG. 1 may be composed of the same data as the codeword CW1 of FIG. 2.

Referring to FIG. 2, the codeword CW1 generated based on the TPC algorithm may include a plurality of data blocks. While not shown, each of the data blocks may include a plurality of data bits. The data blocks may be combined to configure row codewords RC1 to RC4 and column codewords CC1 to CC4. Each data block may be included in a certain one row codeword and at the same time may be included in a certain one column codeword. While FIG. 2 illustrates the codeword CW1 which is configured by the four row codewords RC1 to RC4 and the four column codewords CC1 to CC4, it is to be noted that the numbers of row codewords and column codewords included in a codeword are not limited thereto.

The row codewords RC1 to RC4 may include row parity blocks RP1 to RP4. Each of the row codewords RC1 to RC4 may include a row parity block which is generated as corresponding data blocks are encoded. For example, the row codeword RC2 may include the row parity block RP2 which is generated as data blocks D21 to D24 are encoded. While an encoding operation may be performed based on, for example, the Bose-Chaudhuri-Hocquenghem (BCH) code, to generate each of the row parity blocks RP1 to RP4, it is to be noted that an encoding operation is not limited thereto in the present embodiment and may be performed based on various other ECC algorithms.

The column codewords CC1 to CC4 may include column parity blocks CP1 to CP4. Each of the column codewords CC1 to CC4 may include a column parity block which is generated as corresponding data blocks are encoded. For example, the column codeword CC1 may include the column parity block CP1, which is generated as data blocks D11 to D41 are encoded. While an encoding operation may be performed based on, for example, the BCH code, to generate each of the column parity blocks CP1 to CP4, it is to be noted that an encoding operation is not limited thereto in the present embodiment and may be performed based on various other ECC algorithms.

The decoding operation for the codeword CW1 may include sub-decoding operations for the row codewords RC1 to RC4 and the column codewords CC1 to CC4. The sub-decoding operations for the row codewords RC1 to RC4 may be performed based on the row parity blocks RP1 to RP4. In detail, a decoding operation for each of the row codewords RC1 to RC4 may be performed by correcting error bits included in corresponding data blocks based on a corresponding row parity block. For example, a decoding operation for the row codeword RC2 may be performed by correcting error bits included in the data blocks D21 to D24 based on the row parity block RP2.

Similarly, the sub-decoding operations for the column codewords CC1 to CC4 may be performed based on the column parity blocks CP1 to CP4. In detail, a decoding operation for each of the column codewords CC1 to CC4 may be performed by correcting error bits included in corresponding data blocks based on a corresponding column parity block. For example, a decoding operation for the column codeword CC1 may be performed by correcting error bits included in the data blocks D11 to D41 based on the column parity block CP1.

Figure 3:
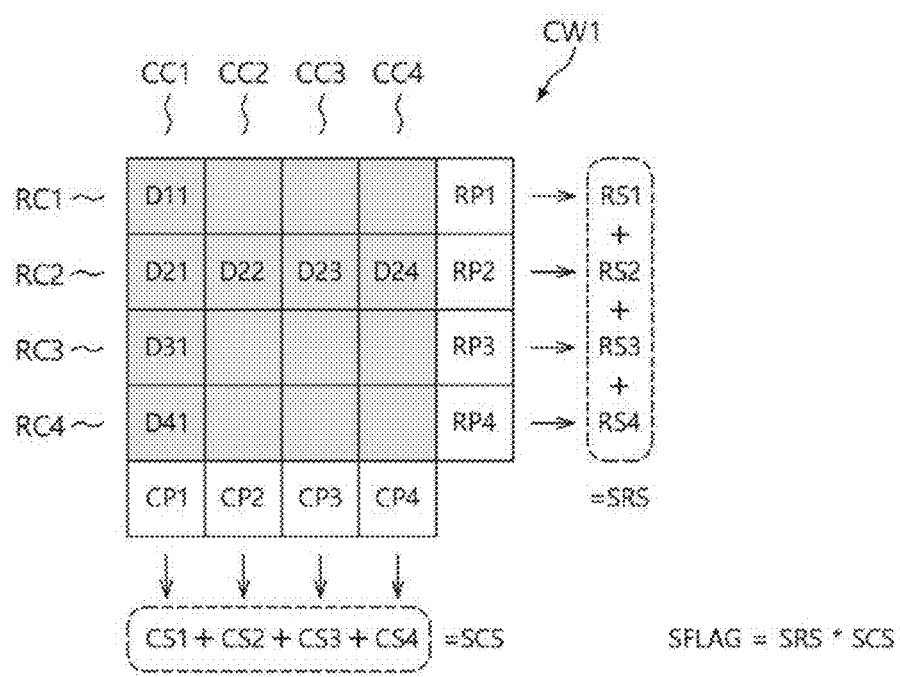
FIG. 3 is a diagram explaining how the decoder of FIG. 1 calculates the flag of codewords.

FIG. 3 is a diagram explaining how the decoder 120 of FIG. 1 calculates the flag SFLAG of the codewords CW1.

Referring to FIG. 3, the decoder 120 may calculate row syndromes RS1 to RS4 of the row codewords RC1 to RC4 and calculate column syndromes CS1 to CS4 of the column codewords CC1 to CC4. Each of the row syndromes RS1 to RS4 may indicate whether a corresponding row codeword includes at least one error bit. For example, each of the row syndromes RS1 to RS4 may be generated as "1" when a corresponding row codeword includes at least one error bit, and may be generated as "0" when the corresponding row codeword does not include an error bit. Similarly, each of the column syndromes CS1 to CS4 may indicate whether a corresponding column codeword includes at least one error bit. For example, each of the column syndromes CS1 to CS4 may be generated as "1" when a corresponding column codeword includes at least one error bit, and may be generated as "0" when the corresponding column codeword does not include an error bit.

A method for generating the row syndromes RS1 to RS4 and the column syndromes CS1 to CS4 may be determined depending on an ECC algorithm that is used in the encoding operation of the row codewords RC1 to RC4 and the column codewords CC1 to CC4. Since the method is generally known to a person skilled in the art, detailed descriptions thereof will be omitted herein.

The flag SFLAG of the codeword CW1 may be the product of the sum SRS of the row syndromes RS1 to RS4 and the sum SCS of the column syndromes CS1 to CS4. Namely, in the embodiment, in order to represent the density of the errors included in the codeword CW1, the product of the sum SRS of the row syndromes RS1 to RS4 and the sum SCS of the column syndromes CS1 to CS4 may be calculated as the flag SFLAG of the codeword CW1. Therefore, in general, the larger the value of the flag SFLAG is, the larger the number of errors included in the code word CW1 may be. On the other hand, the smaller the value of the flag SFLAG is, the smaller the number of errors included in the code word CW1 may be.

As described above, the decoder 120 may perform the decoding process for the codeword CW1 by comparing the expected number of errors that is calculated as the adjustment coefficient is applied to the flag SFLAG and the allowed number of errors. That is, the decoder 120 may perform or skip the decoding operation for the codeword CW1 depending on whether the following Equation 1 is satisfied. The expected number of errors may be the product of the flag SFLAG and the adjustment coefficient A. The allowed number of errors $NoE_\lambda$ may be related with the performance of the decoder 120 that is determined when the decoder 120 is designed.

$$A*SFLAG > NoE_\lambda \quad [\text{Equation 1}]$$

When the equation 1 is satisfied, that is, when the expected number of errors A*SFLAG exceeds the allowed number of errors $NoE_A$, the decoder 120 may skip the decoding operation for the codeword CW1, output a decoding failure signal and terminate the decoding process for the codeword CW1. When the equation 1 is not satisfied, that is, when the expected number of errors A*SFLAG is equal to or less than the allowed number of errors $NoE_A$, the decoder 120 may perform the decoding operation for the codeword CW1.

Hereinbelow, a method for calculating the adjustment coefficient A will be described in detail. The adjustment coefficient A may be determined through a test at the development stage of a decoder.

The following equation 2 indicates that, for a certain ECC algorithm, the number of errors with which the decoding operation may fail, that is, the allowed number of errors $NoE_\lambda$, and the flag SFLAG of a codeword are in a linear relationship. Such a linear relationship may be generally observed when errors are uniformly distributed in the codeword. In the equation 2, the coefficient A1 may be changed depending on an ECC algorithm.

$$NoE_\lambda = A1*SFLAG \quad [\text{Equation 2}]$$

Meanwhile, the test may be performed by using a plurality of test codewords. Test codewords may have uncorrectable errors at the same error rate.

In the test, the flag SFLAG of each of the test codewords may be calculated according to the method described above with reference to FIG. 3. A value that is obtained through dividing the actual number of errors NoE of a given test codeword by the flag SFLAG of the corresponding test codeword may be calculated as the test coefficient TA of the corresponding test codeword. The calculation may be expressed as the following equation 3.

$$TA = NoE/SFLAG \quad [\text{Equation 3}]$$

The average E[TA] of the test coefficients TA of the test codewords may be calculated as the adjustment coefficient A. The calculation may be expressed as the following equation 4.

$$A = E[TA] \quad [\text{Equation 4}]$$

Meanwhile, the adjustment coefficient A is calculated based on the test codewords which have a predetermined error rate. By applying the corresponding method to each of different error rates, the values of adjustment coefficients corresponding to the different error rates, respectively, may be determined. Thus, when a specific error rate is determined together with an allowed number of errors at the time of designing a decoder, an adjustment coefficient corresponding to the determined error rate may be determined and be set in the decoder. The decoder may perform the decoding process based on the set adjustment coefficient.

If uncorrectable test codewords cannot be obtained, a new coefficient A2 may be calculated for correctable test codewords, as in the following equation 5, through the same process as the aforementioned process of deriving the adjustment coefficient A. In the equation 5, a test coefficient TA2 may be a value that is obtained through dividing the actual number of errors of a correctable test codeword by the flag of the corresponding test codeword as described above with reference to the equation 3. The new coefficient A2 may be the average of test coefficients TA2.

$$A2 = E[TA2] \quad [\text{Equation 5}]$$

The adjustment coefficient A may be newly calculated by adding the standard deviation σ of the test coefficients TA2 reflected with reliability β, to the coefficient A2. The reliability β may be calculated through a test. This may be expressed in the following equation 6.

$$A = A2 + \beta \cdot \sigma \quad [\text{Equation 6}]$$

Figure 4:
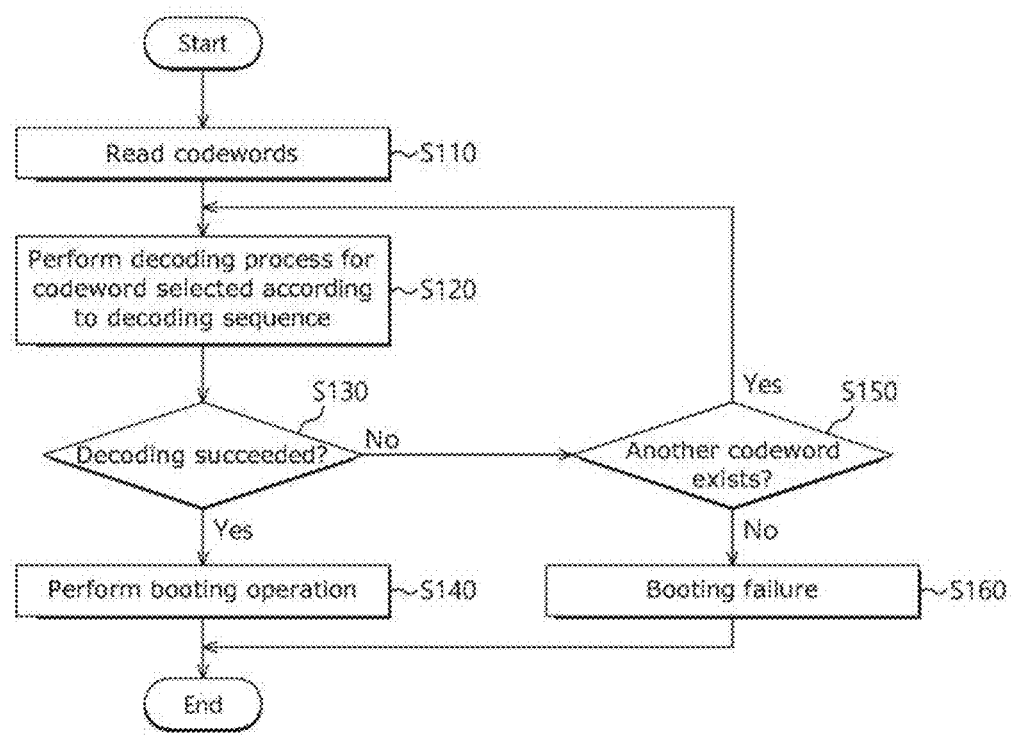
FIG. 4 is a flow chart describing a method for operating the data storage device shown in FIG. 1.

FIG. 4 is a flow chart describing a method for operating the data storage device 10 shown in FIG. 1. Specifically, FIG. 4 illustrates how the controller 100 of FIG. 1 performs a booting operation after being powered on.

Referring to FIG. 4, at step S110, the booting section 110 may read the codewords CW1 to CW3 from the nonvolatile memory device 200. The codewords CW1 to CW3 may be transmitted to the decoder 120.

At step S120, the decoder 120 may perform a decoding process for a selected codeword CW1 among the codewords CW1 to CW3 according to a decoding sequence. The decoding process may be terminated by outputting a decoding success signal or a decoding failure signal.

At step S130, the decoder 120 may determine whether the result of the decoding process for the selected codeword CW1 is a decoding success (i.e., when the output is a decoding success signal). When the result of the decoding process is a decoding success, the process may proceed to step S140.

At the step S140, the booting section 110 may perform a booting operation based on the selected codeword CW1, which is error-corrected through the decoding process.

Meanwhile, when, at the step S130, the result of the decoding process is not a decoding success, that is, is a decoding failure (i.e., when the output is a decoding failure signal), the process may proceed to step S150.

At the step S150, the decoder 120 may determine whether another codeword for which the decoding process is not performed exists among the codewords CW1 to CW3. When another codeword for which the decoding process is not performed exists, the process may proceed to the step S120. In other words, at the step S120, the decoder 120 may perform the decoding process for another codeword selected among the codewords CW1 to CW3 according to the decoding sequence.

Meanwhile, when, at the step S150, another codeword for which the decoding process is not performed does not exist among the codewords CW1 to CW3, that is, when the decoding process is performed for all the read codewords CW1 to CW3, the process may proceed to step S160. As a result, when the result of the decoding process for all the read codewords CW1 to CW3 is a decoding failure, the process may proceed to the step S160.

At the step S160, the booting section 110 may determine that the booting operation has failed.

Figure 5:
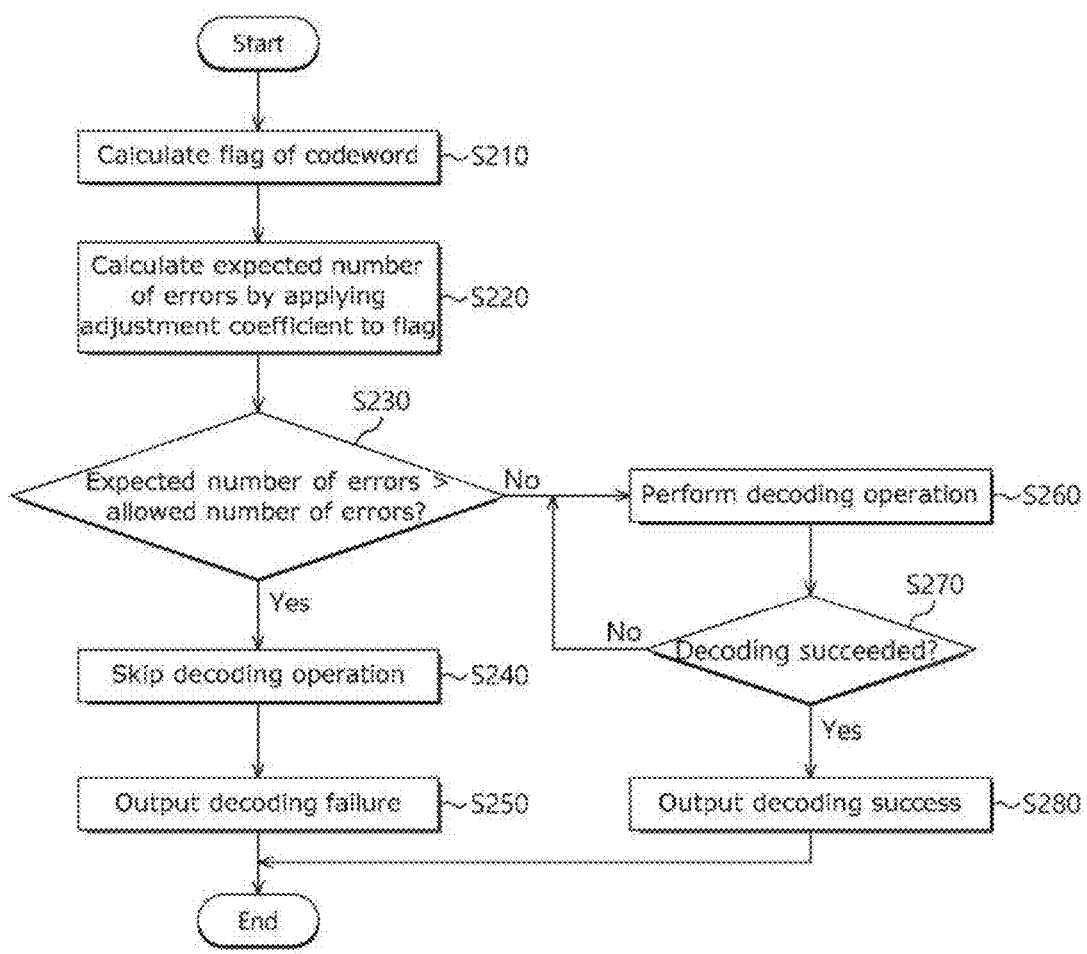
FIG. 5 is a flow chart describing a method for operating the data storage device shown in FIG. 1.

FIG. 5 is a flow chart describing a method for operating the data storage device 10 shown in FIG. 1. Specifically, FIG. 5 illustrates how the decoder 120 of FIG. 1 performs a decoding process for a selected codeword CW1 among the codewords CW1 to CW3. In FIG. 5, the decoding process may be terminated by outputting a decoding success signal or a decoding failure signal. The process shown in FIG. 5 may be a detailed method of performing the step S120 of FIG. 4.

Referring to FIG. 5, at step S210, the decoder 120 may calculate the flag SFLAG of the selected codeword CW1 among the codewords CW1 to CW3. As described above, the decoder 120 may calculate the row syndromes RS1 to RS4 of the row codewords RC1 to RC4 of the selected codeword CW1, calculate the column syndromes CS1 to CS4 of the column codewords CC1 to CC4 of the selected codeword CW1, and calculate as the flag SFLAG the product of the sum SRS of the row syndromes RS1 to RS4 and the sum SCS of the column syndromes CS1 to CS4.

At step S220, the decoder 120 may calculate an expected number of errors by applying an adjustment coefficient A to the flag SFLAG.

At step S230, the decoder 120 may determine whether the expected number of errors exceeds an allowed number of errors. When the expected number of errors exceeds the allowed number of errors, the process may proceed to step S240.

At the step S240, the decoder 120 may skip a decoding operation for the selected codeword CW1.

At step S250, the decoder 120 may terminate the decoding process for the selected codeword CW1 by outputting a decoding failure signal.

Meanwhile, when, at the step S230, the expected number of errors does not exceed the allowed number of errors, the process may proceed to step S260.

At the step S260, the decoder 120 may perform the decoding operation for the selected codeword CW1.

At step S270, the decoder 120 may determine whether the result of performing the decoding operation for the selected codeword CW1 is a decoding success. When the result of performing the decoding operation is a decoding success (i.e., when the output is a decoding success signal), the process may proceed to step S280.

At the step S280, the decoder 120 may terminate the decoding process for the selected codeword CW1 by outputting a decoding success signal.

Meanwhile, when, at the step S270, the result of performing the decoding operation for the selected codeword CW1 is not a decoding success, that is, is a decoding failure (i.e., when the output is a decoding failure signal), the process may proceed to the step S260. Namely, at the step S260, the decoder 120 may repeat the decoding operation for the selected codeword CW1.

Figure 6:
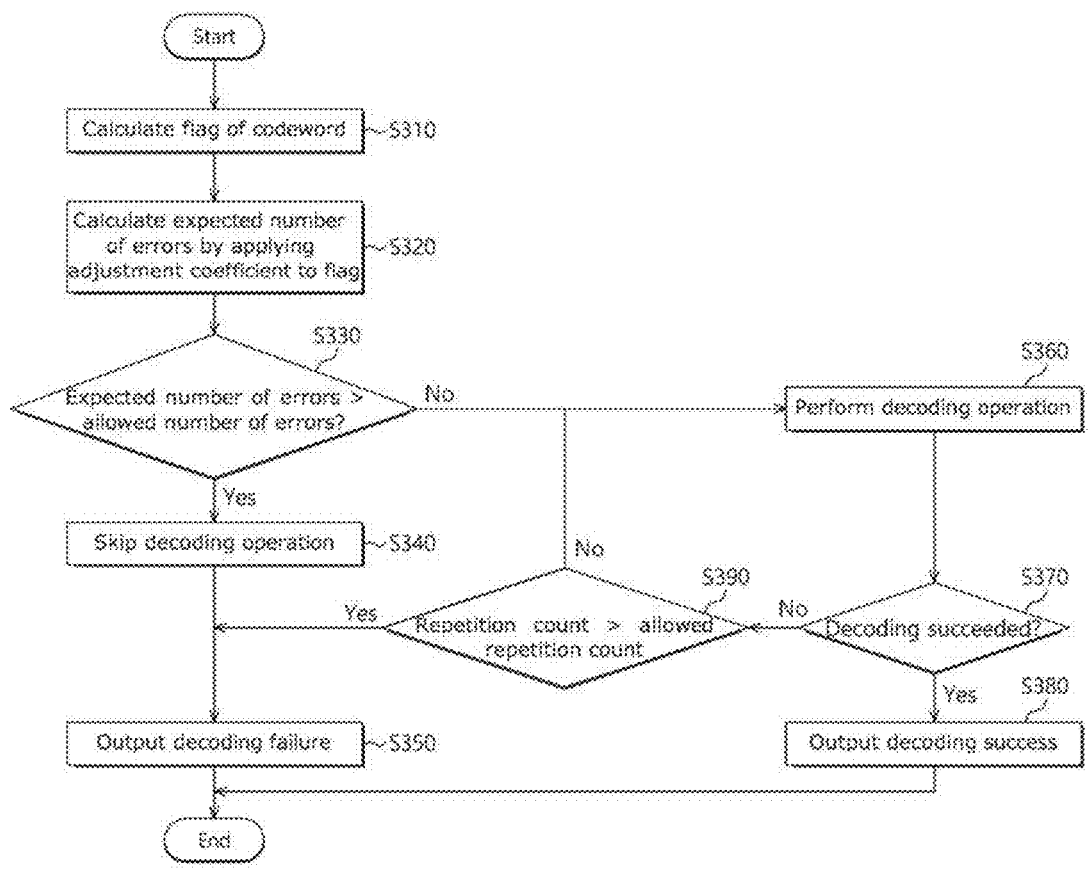
FIG. 6 is a flow chart describing a method for operating the data storage device shown in FIG. 1.

FIG. 6 is a flow chart describing a method for operating the data storage device 10 shown in FIG. 1. Specifically, FIG. 6 illustrates how the decoder 120 of FIG. 1 performs a decoding process for a selected codeword CW1 among the codewords CW1 to CW3. Steps S310 to S380 in the process of FIG. 6 may be substantially the same as the steps S210 to S280 in the process of FIG. 5, and therefore, overlapping descriptions thereof will be omitted herein.

Referring to FIG. 6, when, at the step S370, the result of performing the decoding operation for the selected codeword CW1 is not a decoding success signal, that is, is a decoding failure signal, the process may proceed to step S390.

At the step S390, the decoder 120 may determine whether the repetition count of the decoding operation for the selected codeword CW1 exceeds an allowed repetition count. When the repetition count exceeds the allowed repetition count, the process may proceed to the step S350. That is, at the step S350, the decoder 120 may stop the decoding operation for the selected codeword CW1 and terminate the decoding process for the selected codeword CW1 by outputting a decoding failure signal.

Meanwhile, when, at the step S390, the repetition count does not exceed the allowed repetition count, the process may proceed to the step S360. In other words, at the step S360, the decoder 120 may repeat the decoding operation for the selected codeword CW1.

Figure 7:
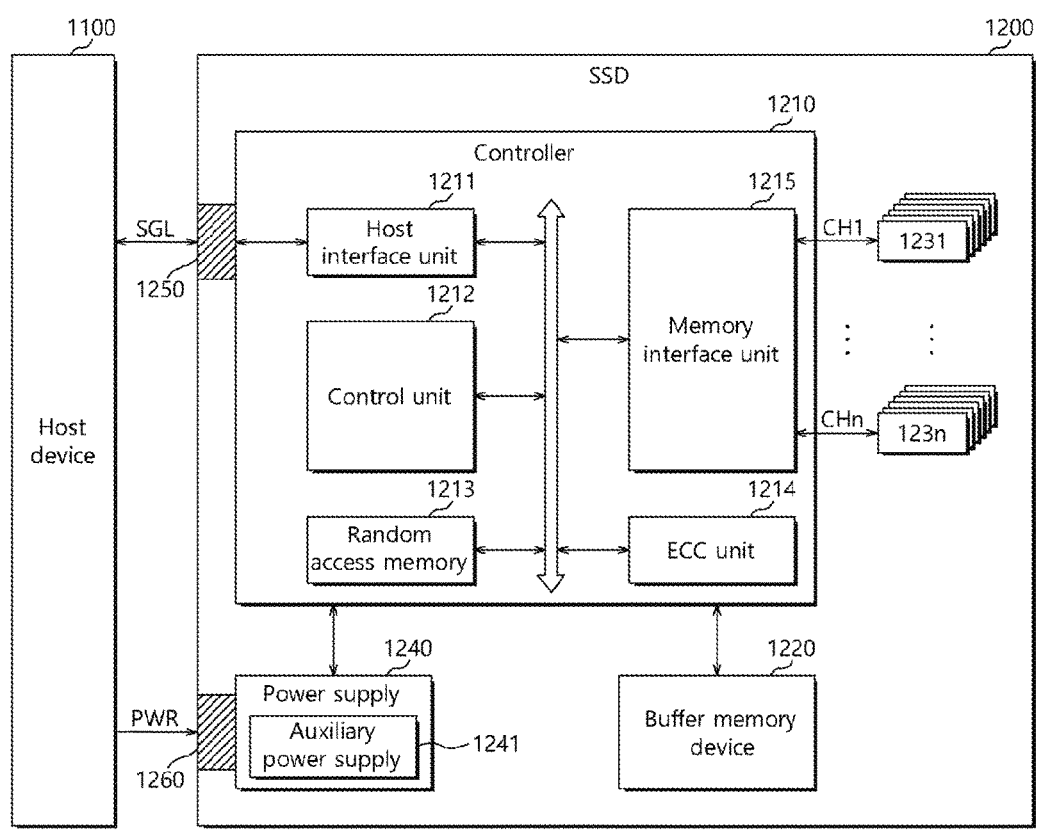
FIG. 7 is a diagram illustrating a data processing system including a solid state drive (SSD) in accordance with an embodiment of the present disclosure.

FIG. 7 is a diagram illustrating a data processing system including a solid state drive (SSD) in accordance with an embodiment of the present disclosure. Referring to FIG. 7, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process a signal SGL inputted from the host device 1100. The control unit 1212 may control operations of background function blocks according to a firmware or a software for driving the SSD 1200. The random access memory 1213 may be used as a working memory for driving such a firmware or software.

The error correction code (ECC) unit 1214 may generate the parity data of data to be transmitted to the nonvolatile memory devices 1231 to 123*n*. The generated parity data may be stored together with the data in the nonvolatile memory devices 1231 to 123*n*. The error correction code (ECC) unit 1214 may detect an error of the data read out from the nonvolatile memory devices 1231 to 123*n*, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123*n*, according to control of the control unit 1212. Moreover, the memory interface unit 1215 may exchange data with the nonvolatile memory devices 1231 to 123*n*, according to control of the control unit 1212. For example, the memory interface unit 1215 may provide the data stored in the buffer memory device 1220, to the nonvolatile memory devices 1231 to 123*n*, or provide the data read out from the nonvolatile memory devices 1231 to 123*n*, to the buffer memory device 1220.

The buffer memory device 1220 may temporarily store data to be stored in the nonvolatile memory devices 1231 to 123*n*. Further, the buffer memory device 1220 may temporarily store the data read out from the nonvolatile memory devices 1231 to 123*n*. The data temporarily stored in the buffer memory device 1220 may be transmitted to the host device 1100 or the nonvolatile memory devices 1231 to 123*n* according to control of the controller 1210.

The nonvolatile memory devices 1231 to 123*n* may be used as storage media of the SSD 1200. The nonvolatile memory devices 1231 to 123*n* may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the background of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 8:
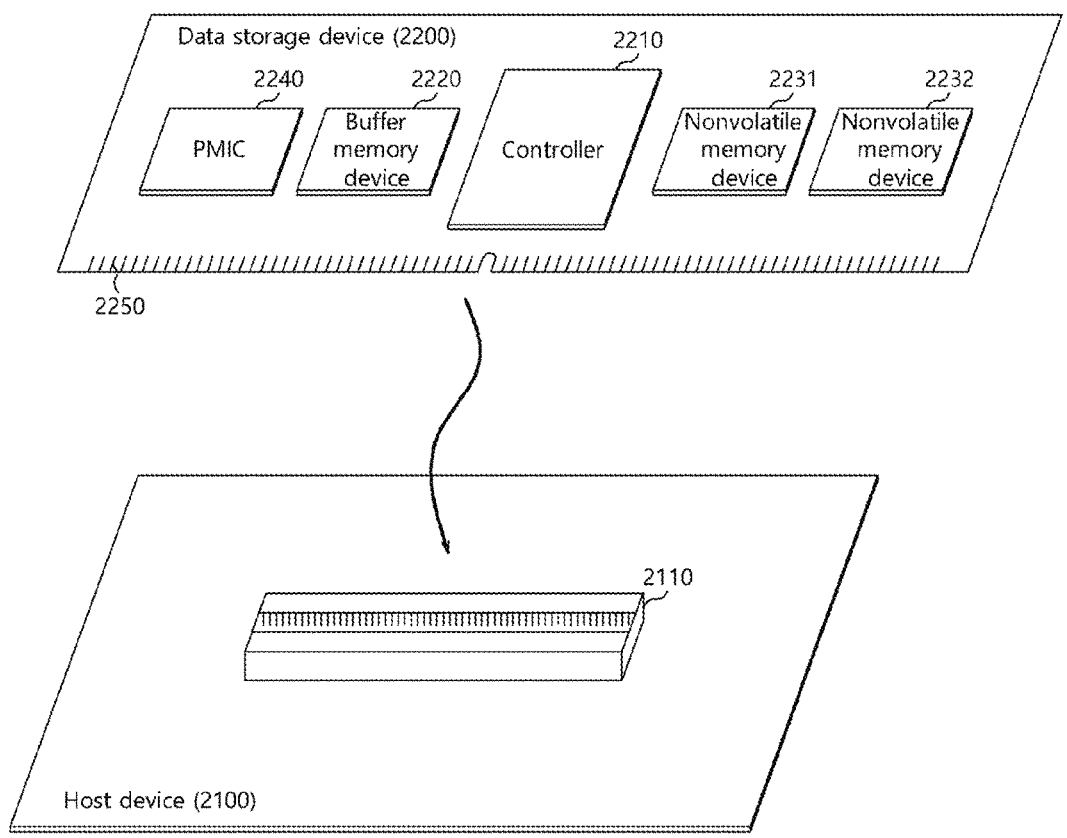
FIG. 8 is a diagram illustrating a data processing system including a data storage device in accordance with an embodiment of the present disclosure.

FIG. 8 is a diagram illustrating a data processing system including a data storage device in accordance with an embodiment of the present disclosure. Referring to FIG. 8, a data processing system 2000 may include a host device 2100 and a data storage device 2200.

The host device 2100 may be configured in the form of a board such as a printed circuit board. Although not shown, the host device 2100 may include background function blocks for performing the function of a host device.

The host device 2100 may include a connection terminal 2110 such as a socket, a slot or a connector. The data storage device 2200 may be mounted to the connection terminal 2110.

The data storage device 2200 may be configured in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 7.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the background of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 9:
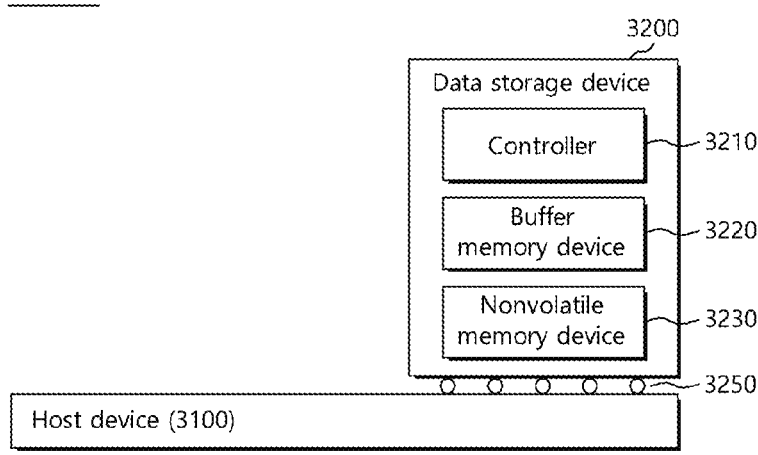
FIG. 9 is a diagram illustrating a data processing system including a data storage device in accordance with an embodiment of the present disclosure.

FIG. 9 is a diagram illustrating a data processing system including a data storage device in accordance with an embodiment of the present disclosure. Referring to FIG. 9, a data processing system 3000 may include a host device 3100 and a data storage device 3200.

The host device 3100 may be configured in the form of a board such as a printed circuit board. Although not shown, the host device 3100 may include background function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 7.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as a storage medium of the data storage device 3200.

Figure 10:
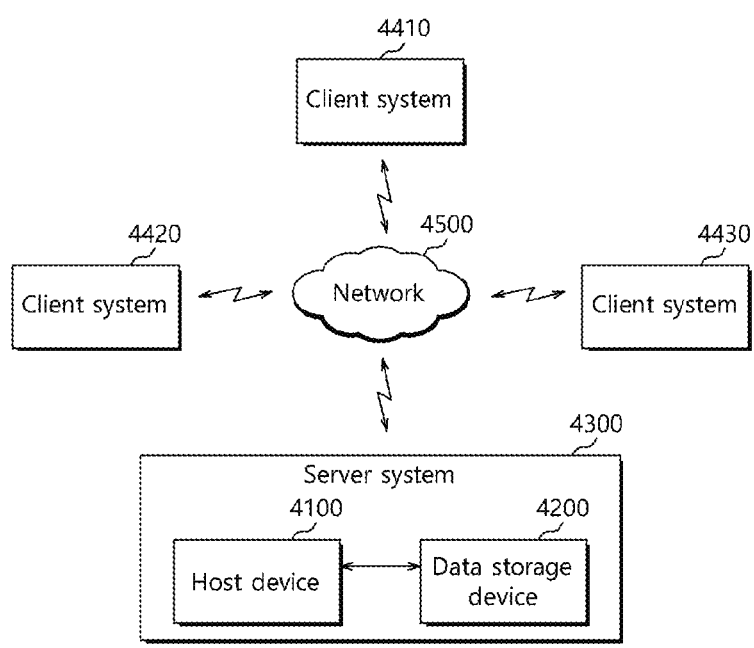
FIG. 10 is a diagram illustrating a network system including a data storage device in accordance with an embodiment of the present disclosure.

FIG. 10 is a diagram illustrating a network system including a data storage device in accordance with an embodiment of the present disclosure. Referring to FIG. 10, a network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be constructed by the data storage device 10 shown in FIG. 1, the SSD 1200 shown in FIG. 7, the data storage device 2200 shown in FIG. 8 or the data storage device 3200 shown in FIG. 9.

Figure 11:
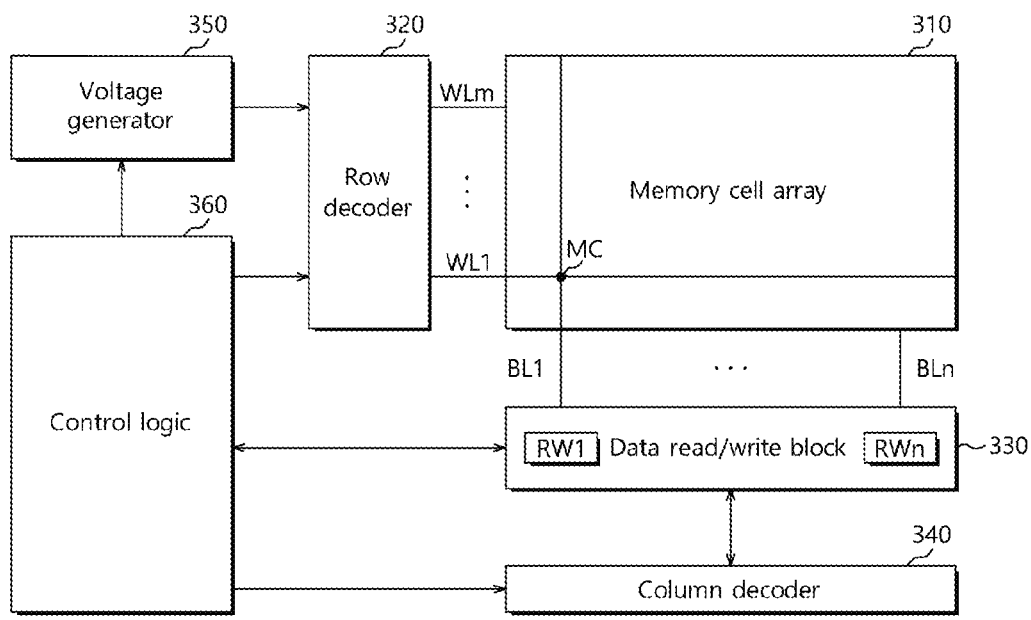
FIG. 11 is a block diagram illustrating a nonvolatile memory device included in a data storage device in accordance with an embodiment of the present disclosure.

FIG. 11 is a block diagram illustrating a nonvolatile memory device included in a data storage device in accordance with an embodiment of the present disclosure. Referring to FIG. 11, a nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/ write block 330 may operate as a write driver or a sense amplifier depending on an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to the control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/ output lines (or data input/output buffers), based on a decoding result.

The voltage generator 350 may generate voltages to be used in background operations of the nonvolatile memory device 300. The voltages generated by the voltage generator 350 may be applied to the memory cells of the memory cell array 310. For example, a write voltage generated in a write operation may be applied to a word line of memory cells for which the write operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory device configured to store a codeword; and
   a controller configured to read the codeword from the nonvolatile memory device, and perform a decoding process for the codeword,
   wherein, when performing the decoding process, the controller calculates a flag of the codeword, calculates an expected number of errors by applying an adjustment coefficient to the flag, compares the expected number of errors to an allowed number of errors, and skips or performs a decoding operation for the codeword depending on a comparison result.

2. The data storage device according to claim 1, wherein the controller calculates row syndromes of row codewords of the codeword, calculates column syndromes of column codewords of the codeword, and calculates a product of a sum of the row syndromes and a sum of the column syndromes, as the flag.

3. The data storage device according to claim 1,
   wherein the adjustment coefficient is an average of test coefficients of a plurality of test codewords which have uncorrectable errors at the same error rate, and
   wherein each of the test coefficients is a value that is obtained through dividing a number of errors of a corresponding test codeword by a flag of the corresponding test codeword.

4. The data storage device according to claim 1,
wherein the adjustment coefficient is a value corresponding to a selected error rate among values of adjustment coefficients corresponding to a plurality of error rates, respectively,
wherein each of the values of the adjustment coefficients is an average of test coefficients of a plurality of test codewords which have uncorrectable errors at a corresponding error rate, and
wherein each of the test coefficients is a value that is obtained through dividing a number of errors of a corresponding test codeword by a flag of the corresponding test codeword.

5. The data storage device according to claim 1, wherein the controller calculates a product of the flag and the adjustment coefficient as the expected number of errors.

6. The data storage device according to claim 1, wherein the controller skips the decoding operation for the codeword when the expected number of errors exceeds the allowed number of errors, and performs the decoding operation for the codeword when the expected number of errors is less the allowed number of errors.

7. The data storage device according to claim 1, wherein the controller calculates a second flag of a second codeword corrected from the codeword while the decoding operation is performed, calculates a second expected number of errors by applying the adjustment coefficient to the second flag, compares the second expected number of errors to the allowed number of errors, and continues or stops the decoding operation for the second codeword depending on a comparison result.

8. The data storage device according to claim 1,
wherein the nonvolatile memory device stores a plurality of codewords which are the same with one another, and
wherein the controller reads the codewords from the nonvolatile memory device, performs the decoding process for each of the codewords until the decoding operation for any one of the codewords succeeds, and performs a booting operation based on a codeword for which the decoding operation succeeds.

9. The data storage device according to claim 1, wherein the controller repeats the decoding operation for the codeword depending on the comparison result, and stops the decoding operation when a repetition count of the decoding operation exceeds an allowed repetition count.

10. The data storage device according to claim 1, wherein the codeword is encoded based on a turbo product code (TPC) algorithm.

11. A method for operating a data storage device, comprising:
reading a codeword from a nonvolatile memory device; and
performing a decoding process for the codeword,
the performing of the decoding process comprising
calculating a flag of the codeword;
calculating an expected number of errors by applying an adjustment coefficient to the flag;
comparing the expected number of errors to an allowed number of errors; and
skipping or performing a decoding operation for the codeword depending on a comparison result.

12. The method according to claim 11, wherein the calculating of the flag comprises:
calculating row syndromes of row codewords of the codeword;
calculating column syndromes of column codewords of the codeword; and
calculating a product of a sum of the row syndromes and a sum of the column syndromes, as the flag.

13. The method according to claim 11,
wherein the adjustment coefficient is an average of test coefficients of a plurality of test codewords which have uncorrectable errors at the same error rate, and
wherein each of the test coefficients is a value that is obtained through dividing a number of errors of a corresponding test codeword by a flag of the corresponding test codeword.

14. The method according to claim 11,
wherein the adjustment coefficient is a value corresponding to a predetermined error rate among values of adjustment coefficients corresponding to a plurality of error rates, respectively,
wherein each of the values of the adjustment coefficients is an average of test coefficients of a plurality of test codewords which have uncorrectable errors at a corresponding error rate, and
wherein each of the test coefficients is a value that is obtained through dividing a number of errors of a corresponding test codeword by a flag of the corresponding test codeword.

15. The method according to claim 11, wherein the calculating of the expected number of errors comprises:
calculating a product of the flag and the adjustment coefficient as the expected number of errors.

16. The method according to claim 11, wherein the skipping or performing of the decoding operation comprises:
skipping the decoding operation for the codeword when the expected number of errors exceeds the allowed number of errors; and
performing the decoding operation for the codeword when the expected number of errors is less the allowed number of errors.

17. The method according to claim 11, wherein the performing of the decoding process comprises:
calculating a second flag of a second codeword corrected from the codeword while the decoding operation is performed;
calculating a second expected number of errors by applying the adjustment coefficient to the second flag;
comparing the second expected number of errors to the allowed number of errors; and
continuing or stopping the decoding operation for the second codeword depending on a comparison result.

18. The method according to claim 11, further comprising:
reading a plurality of codewords which are the same with one another, from the nonvolatile memory device;
performing the decoding process for each of the codewords until the decoding operation for any one of the codewords succeeds; and
performing a booting operation based on a codeword for which the decoding operation succeeds.

19. The method according to claim 11, wherein the skipping or performing of the decoding operation further comprises:
repeating the decoding operation for the codeword depending on the comparison result; and
stopping the decoding operation when a repetition count of the decoding operation exceeds an allowed repetition count.

20. A memory system comprising:
a memory device configured to store a plurality of codewords composed of same data used to boot the memory system; and a controller configured to calculate a flag based on row syndromes and column syndromes of one of the codewords, calculate an expected number of errors based on the flag, and selectively perform a decoding operation for the one of the codewords based on the expected number of errors and an allowed number of errors during booting the memory system.

* * * * *